United States Patent Office 3,527,640

Patented Sept. 8, 1970

3,527,640

LIGHT-SENSITIVE REPRODUCTION MATERIAL COMPRISING LEUCO DYESTUFFS AND LIGHT-SENSITIVE 2,4-DINITROBENZENE-SULPHENYL ESTERS

Ernst-August Hackmann, Wiesbaden-Biebrich, Germany, assignor to Kalle Aktiengesellschaft, Wiesbaden-Biebrich, Germany No Drawing. Filed Oct. 21, 1966, Ser. No. 588,296
Claims priority, application Germany, Oct. 23, 1965, K 57,470
Int. Cl. G03c *1/52*
U.S. Cl. 96—90 4 Claims

ABSTRACT OF THE DISCLOSURE

Light-sensitive reproduction material is prepared through a combination of leuco dyestuffs which are oxidizable to give a distinct color body and an activator selected from the group of light dissociable 2,4-dinitrobenzene-sulphenyl esters.

The present invention relates to a new reproduction material of which the exposed areas become visible without any further intensification. The reproduction material thus is negative-working and, on exposure to light through an original, a copy with reversed tone values is obtained.

It is known that the light-induced oxidation of certain leuco compounds to form dyestuffs can be accelerated by additives. The additives themselves may be subject to chemical reactions by means of light or act as activators only. In the first case, probably radicals are formed on exposure to light from the light-sensitive additive, which oxidize the leuco dyestuffs to give the dyestuffs. Both effects have been profited from in reproduction engineering. The reproduction material of the present invention uses additives of the kind which probably decompose into radicals upon exposure to light.

A reproduction material using the same principle is described in U.S. Pat. No. 3,042,515, for example. The light-sensitive layer applied to a carrier, besides leuco triphenylmethane dyestuffs, contains halogen compounds, preferably tetrabromomethane, which, upon exposure to light, split off halogen radicals. After exposure to light, these reproduction materials must be fixed, i.e. the excessive halogen compound must be removed from the layer. With easily volatile halogen compounds this is done by heating the exposed reproduction material and, with difficulty volatile halogen compounds, by washing out with suitable organic solvents. Because of the necessary, relatively toxic and often also skin-irritating halogen compounds, the reproduction materials have hitherto not been able to be successful.

In the Belgian Pat. No. 649,723, a reproduction material is described which, besides leuco dyestuffs, contains 2,2′-, 4,4′-, 5,5′-hexaphenyl-1,1′-bisimidazolyl derivatives. It is known that this additive, upon exposure to light, also decomposes into radicals which oxidize the leuco dyestuffs. This material has the decisive disadvantage for practical use that the bisimidazolyl derivatives as well as the light decomposition products resulting therefrom are soluble only very difficultly in usual organic solvents so that fixing is hardly possible.

Furthermore, the known materials are relatively insensitive to light so that long exposure times are necessary with ultraviolet light at high light intensity. For these reasons too, the known reproduction materials with layers of leuco dyestuffs and additives forming radicals upon exposure to light have not been able to be successful in practice.

Because of the simple processing and because of the wide range of variations due to the plurality of known leuco compounds, reproduction materials using such compounds would be suitable for the reproduction field provided that the abovementioned drawbacks could be avoided. It is therefore an object of the present invention to provide a reproduction material with a light-sensitive layer based on leuco dyestuff and radical-forming additive, the light-sensitivity of which at least corresponds to that of accepted reproduction materials, which does not contain toxic additives and which can easily be fixed. More particularly, it has been an object of the invention to find a substance or several substances which as additives to leuco dyestuffs in a thin layer on suitable carriers upon exposure to light effect the oxidation of the leuco dyestuffs to form the dyes.

A great number of substances are known which are chemically changed by exposure to light. Systematic tests of all these substances with respect to their suitability as additives in reproduction layers containing leuco compounds have proved to be not practicable because of the plurality and since most of the initially tested substances showed either no or only a little effect.

It has therefore been surprising to find that reproduction materials comprising a carrier and a light-sensitive layer thereon comprising at least one leuco dyestuff and a component which on exposure to light effects the oxidation of the leuco dyestuff to form a dye, and which, as the component effecting the oxidation, contain one or more 2,4-dinitrobenzene-sulphenylesters of the general formula

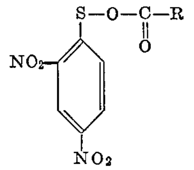

wherein R is an aryl, alkyl or aralkyl radical, are very light-sensitive.

It has been known that 2,4-dinitrobenzene-sulphenylester can be split photolytically (J. Chem. Soc., London, 1965, pp. 3571–3578), but it could not be seen from the mentioned publication that these esters would be suitable as additives for reproduction layers with leuco dyestuffs. From the publication it was to be seen only that as main exposure products the carbonic acids corresponding to the ester and 2,4-dinitrodiphenylsulphide are formed in benzene solution.

Among the 2,4-dinitrobenzene-sulphenylesters the esters deriving from the acetic acid, the phenylacetic acid and the caproic acid have proved to be particularly suitable. These esters in the applied quantities in the layer are harmless also toxicologically. The preparation of the 2,4-dinitrobenzene-sulphenylesters is simple. A detailed description of the preparation of the 2,4-dinitrobenzene-sulphenylacetate is to be found in the J. Amer. Chem. Soc., 1956, 78, p. 1207. The other esters can be prepared correspondingly.

Furthermore, it is surprising that, together with the additive of the present invention, a very large number of leuco compounds can be used. Leuco compounds mean such compounds as are either colourless or only slightly coloured and which can be converted by dehydration into the corresponding dyestuffs. As particularly suitable leuco dyestuff classes there should be mentioned, for example: leuco-triaryl-methane dyestuffs, xanthenes aryl-substituted in nine-position, thioxanthenes aryl-substituted in nine-position, leuco-dihydroanthracenes, bisindolyl-arylmethanes, condensation products from pyrroles and aromatic aldehydes, and condensation products from pyrazolones and aromatic aldehydes. The accompanying Table I indicates the chemical names of the leuco compounds hitherto tested and found to be particularly suitable. The names are provided with consecutive numbers to which reference is made below.

TABLE I (1) bis-(2-methyl-indolyl)-phenyl-methane
(2) bis-(1,2-dimethyl-indolyl)-phenyl-methane
(3) bis-(2-phenyl-indolyl)phenyl-methane
(4) bis-(1-methyl-2-phenyl-indolyl)-4-dimethylamino-phenyl-methane
(5) bis-(2-methyl-indolyl)-4′-dimethylaminophenyl-methane
(6) 1-phenyl-3,3-bis-(1′-methyl-2′-phenyl-indolyl)-propene-(1,2)
(7) bis-(2-methyl-indolyl)-3′,4′-dimethoxyphenyl-methane
(8) bis-(2-methyl-indolyl)-4′-chlorophenyl-methane
(9) bis-(2-methyl-indolyl)-3′,4′-dichlorophenyl-methane
(10) bis-(2-methyl-indolyl)-4′-nitrophenylmethane
(11) bis-(1-methyl-2-phenyl-indolyl)-phenyl-methane
(12) bis-(1-methyl-2-phenyl-indolyl)-3′,4′-dichloro-phenyl-methane
(13) bis-[1-phenyl-2,3-dimethyl-pyrazolone-(5)-yl-(4)]-4′-dimethylaminophenyl-methane
(14) bis-[1-phenyl-2,3-dimethyl-pyrazolone-(5)-yl-(4).-phenyl-methane
(15) bis-[2-methyl-4-phenyl-3-acetyl-pyrrolyl-(5)]-phenyl-methane
(16) tri-(p-dimethylaminophenyl)-methane
(17) bis-(p-dimethylaminophenyl)-phenyl-methane
(18) 4,4′,4″-tri-(dimethylamino)-phthalophenone
(19) bis-(2-hydroxy-4-dimethylaminophenyl)-4′-dimethylaminophenyl-methane
(20) tri-(4′-methyl-diphenylaminyl-(4)-methane
(21) bis-(4-dimethylaminophenyl)-4′-phenylaminonaphthyl-(1′)-methane
(22)-bis-(4′-methyl-diphenylaminyl-(1))-3″,4‴-dimethyl-diphenylaminyl-(1″)-methane
(23) tri-(4′-methoxy-diphenylaminyl-(1))-methane
(24) bis-(4,4′-dimethylaminophenyl)-4″-acetamino-phenyl-methane
(25) 2,7-bis-dimethylamino-9-p-dimethylaminophenyl-xanthene
(26) 2,7-bis-diethylamino-9-m-nitrophenyl-xanthene
(27) 2,7-bis-dimethylamino-10-p-dimethylaminophenyl-9,10-dihydro-9,9-dimethyl-anthracene Since the 2,4-dinitrobenzene-sulphenylesters are very effective, good results are obtained already with relatively small quantities in the reproduction layer. Portions of 10 percent by weight in the reproduction layer are sufficient for obtaining absolutely useful copies.

Quantities larger than about 80 percent by weight of the reproduction layer are not recommended since then the fixation involves difficulties. Mixing ratios of one part 2,4-dinitrobenzene-sulphenylester to two parts leuco dyestuff have proved to be favourable, since then high colour intensity with high speed of the dyestuff formation, i.e. high light-sensitivity, is obtained. The surface weight of the light-sensitive layer should be in the range of 0.1 to 5 g./m.². With lower surface weights higher light-sensitivity is obtained but the copies then become less rich in contrasts. By means of higher surface weights no increase in the colour intensity is obtained.

The greatest light-sensitivity of the reproduction material lies in the longwave ultraviolet. But a certain light-sensitivity is also in the shortwave visible light. Sensitizing by means of which the sensitivity is displaced somewhat more to the longer-wave zone is principally possible.

Processing of the reproduction material is performed in the usual manner. Exposure to light is performed under a negative original, a visible positive already resulting thereby. When using a high-pressure mercury lamp of high intensity, reenlargement of negative microfilms onto the reproduction material of the present invention is also possible with acceptable exposure times.

After exposure to light, fixation is necessary since, because of the presence of the 2,4-dinitrobenzene-sulphenylester, the reproduction material is still light-sensitive at the unexposed areas. Fixation is performed in the simplest way in that the excessive 2,4-dinitrobenzene-sulphenylester and the unreacted leuco dyestuff are removed with a suitable solvent. Light petroleum ether and similar liquid hydrocarbons have proved to be particularly suitable for this purpose. It is sufficient to wipe over the reproduction material with a solvent-wet cotton pad.

For preparing the reproduction material of the present invention, a solution of one or more leuco dyestuffs with one or more 2,4-dinitrobenzene-sulphenylesters is prepared. This solution is applied to a carrier in a suitable manner and then the solvent is evaporated.

Suitable solvents are acetone or benzene, for example, since both components are soluble therein. The concentration of the dissolved substance advantageously is in the range of 1 to 5 percent by weight, calculated on the solvent.

Applying the solution onto the carrier may be performed in a known manner, e.g. by spraying or coating.

Suitable carriers for the light-sensitive layer are all sheet materials used in the reproduction field, e.g. metal foils and plastics films, glass, wood, textiles, films from cellulose derivatives as well as preferably paper. For the purpose of better adherence of the light-sensitive layer to smooth carrier materials the latter may be provided with a precoat. The precoats preferably consist of pigments, such as finely ground alkaline-earth sulphates, dispersed silicic acid, powdered silicates, such as kaolin, undissolved starch, finely divided aluminum oxide, magnesium oxide or titanium dioxide. The pigments usually are applied to the carrier with a binder. Suitable binders are polyvinyl acetate, casein, swelled starch, carboxymethyl cellulose, carboxymethyl amylose and various copolymers of acrylic acid, e.g. such with vinylchloride, styrene and other vinyl compounds.

Using carriers with precoats containing binders is favourable since, during coating with the light-sensitive solution, the binder is affected by the solvent so that the reproduction layer somewhat penetrates into the precoat containing the binder. A considerable increase in the adherence of the reproduction layer on the carrier is achieved thereby. To a certain extent, this effect can also be achieved on carriers without a binder, if some binder is added to the coating solution. But this quantity should be small and not exceed about 5 percent by weight, calculated on the finished layer. Suitable binders are the above-mentioned polymers.

The reproduction material of the present invention is stable in storage, as far as known toxicologically harmless and easily processible. Either contact copies or, when using a suitable carrier, reflex copies can be prepared with it. Since the described reproduction material is negative-working, it is particularly suitable for the re-enlargement of microfilms. A further advantage is that, due to the great number of suitable leuco dyestuffs, a large scale of shades is accessible.

The invention is further illustrated by way of the following example the results of which are summarized in Table II.

EXAMPLE

Solutions were prepared each containing 10 mg. of 2,4-dinitrobenzene-sulphenylacetate and 10 ml. of benzene. 20 mg. of a leuco dyestuff were then added to these solutions and likewise dissolved with stirring. The individual leuco dyestuffs concerned are to be seen in Table II. The numbers indicated there refer to the formulae of Table I. The solutions thus prepared were applied to baryta paper by whirl coating means. The quantity was so measured that, after evaporation of the solvent and drying, a surface weight of the reproduction layer of 0.1 to 0.4 g./m.$^2$ resulted therefrom.

The reproduction material thus prepared was exposed to light in a commercial continuous exposure device through a transparent negative original with a 700 watt tubular high-pressure mercury lamp. The feed speed of paper and original was 1 m./min. Positive copies were obtained of the shade which corresponded to the colour of the dyestuff formed from the leuco dyestuff. The copies were fixed by rinsing them with light petroleum ether. The shades of the copies obtained with the various leuco dyestuffs are summarized in the table below.

TABLE II

| Leuco dyestuff: | Shade |
|---|---|
| 1, 2, 7, 8, 9, 13 | Red. |
| 3, 11, 12 | Reddish brown. |
| 5, 16, 24 | Blue. |
| 6, 17, 18, 19, 20, 21, 22, 23 | Green. |
| 10, 25 | Violet. |

The above examples have been presented for the purpose of illustration and should not be taken to limit the scope of the present invention. It will be apparent that the described examples are capable of many variations and modifications which are likewise to be included within the scope of the present invention as set forth in the appended claims.

What is claimed is:

1. Reproduction material comprising a support and a coating thereon comprising a light-sensitive composition comprising a leuco dyestuff and a light-sensitive compound which effects the oxidation of said leuco dyestuff, said light-sensitive compound being a 2,4-dinitrobenzene-sulphenylester of the general formula:

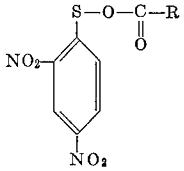

wherein R is an aryl, alkyl, or aralkyl radical.

2. Material according to claim 1 wherein the ratio of leuco dyestuff to sulphenylester is between about 9:1 and 1:4.

3. Material according to claim 1 wherein the ratio of leuco dyestuff to sulphenylester is between about 3:1 and 3:2.

4. Material according to claim 1 wherein said light-sensitive compound is selected from the group consisting of the 2,4-dinitrobenzenesulphenylesters of acetic, phenylacetic, and caproic acids.

References Cited

UNITED STATES PATENTS 3,113,024 12/1963 Sprague et al. ________ 96—48

OTHER REFERENCES

"Photochemical Transformations," part XIX, "Some Photosensitive Protecting Groups," Barton et al., Chemical Society, London Journal, 1965, pp. 3571–3578.

NORMAN G. TORCHIN, Primary Examiner

J. R. HIGHTOWER, Assistant Examiner

U.S. Cl. X.R.

96—48